(12) United States Patent
DINC et al.

(10) Patent No.: US 10,498,303 B2
(45) Date of Patent: Dec. 3, 2019

(54) SIGNAL LEVEL DETECTION AND OVERRANGE SIGNAL LIMITER AND CLAMP FOR ELECTRONIC CIRCUITS

(71) Applicant: Analog Devices, Inc., Norwood, MA (US)

(72) Inventors: Huseyin DINC, Greensboro, NC (US); Ronald Bryce Gray, III, Oak Ridge, NC (US); Ahmed Mohamed Abdelatty ALI, Oak Ridge, NC (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 15/887,544

(22) Filed: Feb. 2, 2018

(65) Prior Publication Data
US 2019/0245501 A1 Aug. 8, 2019

(51) Int. Cl.
*H03G 3/30* (2006.01)
*H03F 1/52* (2006.01)

(52) U.S. Cl.
CPC ............... *H03G 3/30* (2013.01); *H03F 1/523* (2013.01); *H03F 2200/258* (2013.01); *H03F 2200/78* (2013.01)

(58) Field of Classification Search
CPC .................................. H03G 3/30; H03F 1/523
See application file for complete search history.

(56) References Cited

U.S. PATENT DOCUMENTS

| | | | |
|---|---|---|---|
| 4,371,842 A | 2/1983 | Lee | |
| 5,640,118 A | 6/1997 | Drouot | |
| 7,511,930 B2* | 3/2009 | Apfel | H02H 9/041 361/55 |
| 8,638,078 B2 | 1/2014 | Kudo et al. | |
| 2011/0304400 A1* | 12/2011 | Stanley | H03F 1/26 330/295 |
| 2015/0338865 A1 | 11/2015 | Ciubotaru | |
| 2016/0072275 A1 | 3/2016 | Caldwell et al. | |
| 2018/0069480 A1* | 3/2018 | Koo | H02M 3/33523 |

OTHER PUBLICATIONS

Shridhar Atamaram More, *Application Report SLAA593—Sep. 2013, ADC Input Protection, Digital/Analog Converters*, Texas Instruments, 4 pages.
Bob Chao, *Voltage Clamp Circuits for Ultra-Low-Voltage Apps*, Electronic Products, http://electronicproducts.com, Mar. 2008, 6 pages.

* cited by examiner

*Primary Examiner* — Patricia T Nguyen
(74) *Attorney, Agent, or Firm* — Patent Capital Group

(57) ABSTRACT

One embodiment is an apparatus including a detector circuit electrically coupled between a signal source and a second circuit, the signal source generating a first signal, the detector circuit detecting a level of the first signal and generating a first control signal when the detected level of the first signal exceeds a first threshold value, and a clamping switch electrically coupled to receive the first control signal from the detector circuit, the clamping switch including a multi-terminal active device. The first control signal controls a state of the clamping switch such that the clamping switch clamps a level of a signal applied to the second circuit when the level of the first signal exceeds the first threshold value.

20 Claims, 8 Drawing Sheets

SIGNAL LEVEL DETECTION AND OVERRANGE SIGNAL LIMITER AND CLAMP FOR ELECTRONIC CIRCUITS

FIELD OF THE DISCLOSURE

This disclosure relates in general to the field of electronic circuits and, more particularly, to techniques for implementing an overrange signal detector, limiter and clamp in connection with such circuits.

BACKGROUND

In many electronic circuits, a signal from a first circuit may be applied to a second circuit, wherein the applied signal exceeds a safe or otherwise optimal range of the second. Such a signal is referred to herein as an "overrange" signal. One way to protect a second circuit against such overrange signals is to deploy a diode-based clamp that operates to limit the voltage applied to the second circuit. Diode-based clamp solutions suffer certain deficiencies, including that they may be inaccurate, as the threshold voltage of a diode is known to shift with temperature. Additionally, diode-based clamps require high speed voltage references to set and maintain an accurate value. Moreover, while diode-based clamps function acceptably once they are forward biased, they suffer leakage leading up to their turn-on that can significantly impact distortion for signal paths that may require high dynamic range performance. Still further, effective clamping requires the use of relatively large diodes that add non-linear capacitances to the signal path, thereby degrading the linearity of the system.

SUMMARY OF THE DISCLOSURE

One embodiment is an apparatus including a detector circuit electrically coupled to a signal source and a second circuit, the signal source generating a first signal, the detector circuit detecting a level of the first signal and generating a first control signal when the detected level of the first signal exceeds a first threshold value, and a clamping switch electrically coupled to receive the first control signal from the detector circuit, the clamping switch including a multi-terminal active device. The first control signal controls a state of the clamping switch such that the clamping switch clamps a level of a signal applied to the second circuit when the level of the first signal exceeds the first threshold value.

The detector circuit may include a peak detector circuit for detecting a peak value of the first signal and a comparator for comparing the detected peak value of the first signal with the first threshold value and generating the control signal when the detected peak value of the first signal exceeds the first threshold value. In some embodiments, the comparator is implemented as an amplifier. The multi-terminal active device may exhibit a variable impedance between first and second terminals thereof and a value of the variable impedance is controlled by a third terminal thereof. The first control signal may be applied to the third terminal of the multi-terminal active device.

In certain embodiments, the clamping switch includes at least one of a p-channel metal oxide semiconductor field effect transistor ("PMOSFET"), an n-channel MOSFET ("NMOSFET"), a complementary MOSFET ("CMOSFET"), and a bi-polar junction transistor ("BJT"). Bits corresponding to the first control signal may be input to an Automatic Gain Control ("AGC") system for adjusting a level of the first signal at the signal source. The detector circuit may further generate a second control signal when the level of the first signal exceeds a second threshold value and bits corresponding to the second control signal may be input to the AGC system for adjusting a level of the first signal.

Another embodiment is an apparatus including a detector circuit electrically coupled between a signal source and a second circuit, the signal source generating a first signal, the detector circuit comparing the first signal with first and second threshold values and generating a control signal when the detected level of the first signal exceeds the first threshold value or falls below the second threshold value; and a clamping switch electrically coupled to receive the control signal from the detector circuit, the clamping switch comprising a multi-terminal active device. The control signal controls a state of the clamping switch such that the clamping switch clamps a level of a signal applied to the second circuit when the detected level of the first signal exceeds the first threshold value or falls below the second threshold value. In certain embodiments, the detector circuit is implemented using a pair of cross-coupled fast amplifiers. In some embodiments, a first one of the pair of cross-coupled fast amplifiers is configured to generate the control signal when the first signal exceeds the first threshold value. In other embodiments, a second one of the pair of cross-coupled fast amplifiers is configured to generate the control signal when the first signal falls below the second threshold value.

In some embodiments, the multi-terminal active device exhibits a variable impedance between first and second terminals thereof and wherein a value of the variable impedance is controlled by the third terminal and wherein the control signal is applied to the third terminal of the multi-terminal active device. The clamping switch may include at least one of a p-channel metal oxide semiconductor field effect transistor ("PMOSFET"), an n-channel MOSFET ("NMOSFET"), a complementary MOSFET ("CMOSFET"), and a bi-polar junction transistor ("BJT"). In certain embodiments, bits corresponding to the control signal are input to an Automatic Gain Control ("AGC") system for adjusting a level of the first signal.

Yet another embodiment is a method comprising determining whether an absolute value of an input signal is greater than a maximum threshold value and if so, clamping a level of the input signal. The method further comprises, subsequent to the clamping, determining whether the absolute value of the input signal is less than a safe threshold value and if not, continuing to clamp the input signal level. The method further comprises, if the absolute value of the input signal is less than a safe threshold value, ceasing clamping of the input signal level. In one embodiment, the determining whether the absolute value of the input signal is greater than the maximum threshold value may be performed using at least one fast comparator circuit and the determining whether the absolute value of the input signal is less than a safe threshold value may be performed using at least one accurate comparator circuit. In certain embodiments, the method further comprises, if the absolute value of the input signal is greater than the maximum threshold value, connecting the at least one accurate comparator circuit to a source of the input signal. In other embodiments, the method further comprises, if the absolute value of the input signal is less than the safe threshold value, disconnecting the at least one accurate comparator circuit from the input signal source.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION OF EXAMPLE EMBODIMENTS

Embodiments described herein include systems and methods for detecting an overrange signal and responding to the detection by limiting and/or reducing the amount of signal applied to a circuit under protection. The systems and method described herein operate to protect the circuit under protection in a manner that is well-controlled in both time and voltage domains and that minimizes the impact on the performance and linearity of the circuit under protection. The limiting and/or reduction may be applied for a certain length of time and/or until the applied signal no longer needs to be limited or reduced. The protection afforded by embodiments described herein is very important in fine geometry processes in which the maximum permissible voltage devices can reliably tolerate is well below the possible input levels that may be applied. In addition to over-voltage protection, embodiments described herein enable the generation of one or more digital bits that indicate the signal has exceeded a threshold and/or an overrange condition exists and can therefore be used to implement automatic gain control ("AGC") of the system as a whole.

Figure 1:
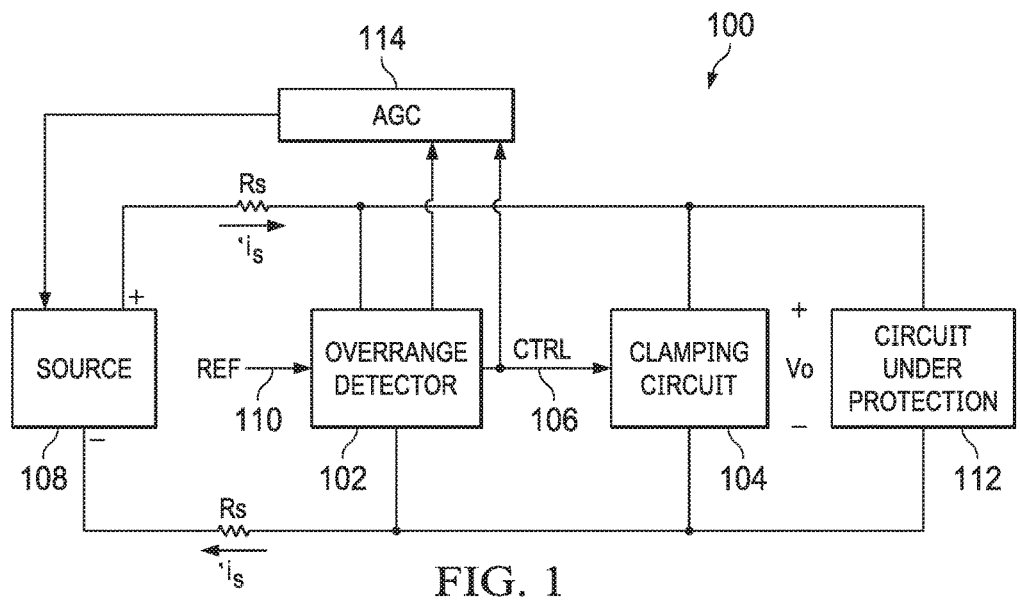
FIG. 1 illustrates a simplified block diagram of an overrange signal limitation system implemented in accordance with embodiments described herein.

FIG. 1 illustrates a simplified block diagram of an overrange signal limitation system 100 in accordance with embodiments described herein. As shown in FIG. 1, in a basic embodiment, the system 100 includes an overrange detection circuit (or "overrange detector") 102 and a clamping circuit 104 the operation of which is controlled by a control signal ("CTRL") 106 from the overrange detection circuit. As will be described in greater detail hereinbelow, the overrange detection circuit 102 operates to detect an amplitude of a signal generated by a source 108 and compare the detected amplitude with a clamp reference threshold ("REF") 110. When the detected signal amplitude exceeds the clamp reference threshold 110, corresponding to an overrange condition, the overrange detection circuit 102 turns on the clamping circuit 104 via the control signal 106 to reduce the impedance seen by the detected signal and limit the amplitude of the signal applied to a circuit under protection ("CUP") 112. In accordance with various embodiments, and as will be described in greater detail below, the clamping circuit 104 may be turned fully on or fully off or may be implemented as a variable impedance the value of which is controlled by the control signal 106 from the overrange detection circuit 102. In addition, in response to detection of an overrange condition, bits indicative of the overrange condition may be generated by the overrange detection circuit 102 and used to provide automatic gain control ("AGC") 114 for the entire system 100. This AGC control can be to protect the circuits, or to optimize the performance of the system.

Additionally and/or alternatively, in some embodiments, the overrange detector may be configured to detect whether the signal to be applied to the CUP has exceeded one or more additional thresholds, whether or not those thresholds correspond to an overrange condition. Bits generated by the overrange detector in these situations may also be used to provide AGC 114 for the entire system 100. For example, the information indicated by such bits may be used to ramp up or down the input signal at the source 108 as appropriate.

Figure 2:
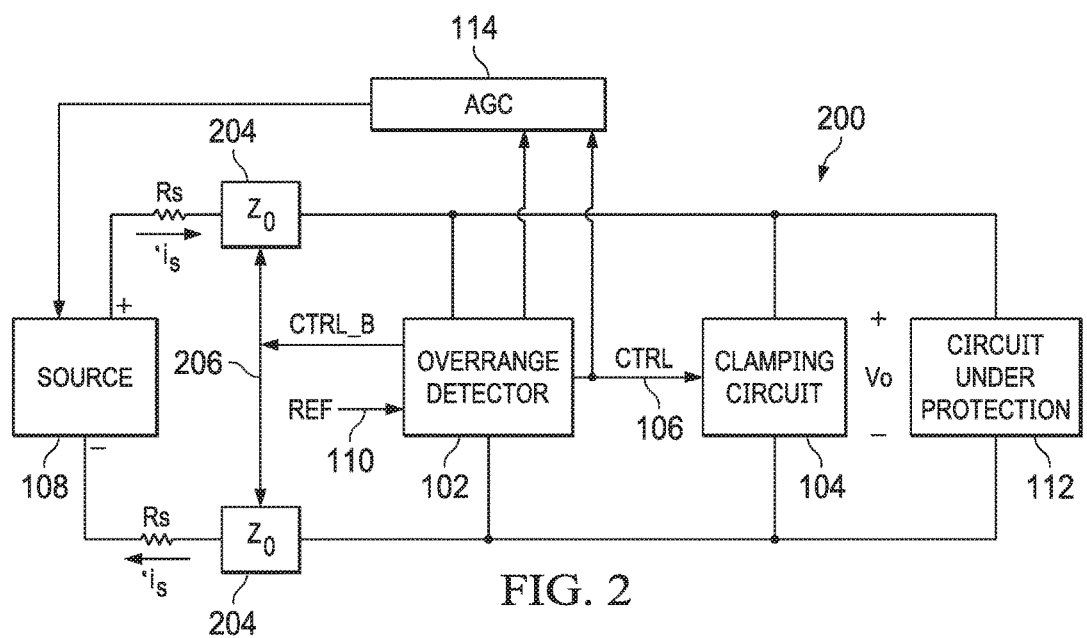
FIG. 2 illustrates a simplified block diagram of an alternative overrange signal limitation system implemented in accordance with embodiments described.

FIG. 2 illustrates a simplified block diagram of an alternative overrange signal limitation system 200 in accordance with embodiments described herein. As shown in FIG. 2, the system 200 includes a pair of series limiters 204, which may be implemented using variable impedance devices controlled by CTRL or a second control signal ("CTRL_B") 206 from the overrange detection circuit 102, thereby providing a means by which the source 108 may be partially or fully isolated from the CUP 112 by the series limiters 204 depending on the impedance value thereof as controlled by the overrange detection circuit 102 in response to detection of an overrange condition. In this manner, the system 200 may provide protection to the CUP 112 in multiple stages, including a variable clamping of the signal input to the CUP (via the overrange detector 102 and the clamping circuit 104) and a partial or complete isolation of the CUP from the voltage source 108 via the series limiters 204.

Figure 3:
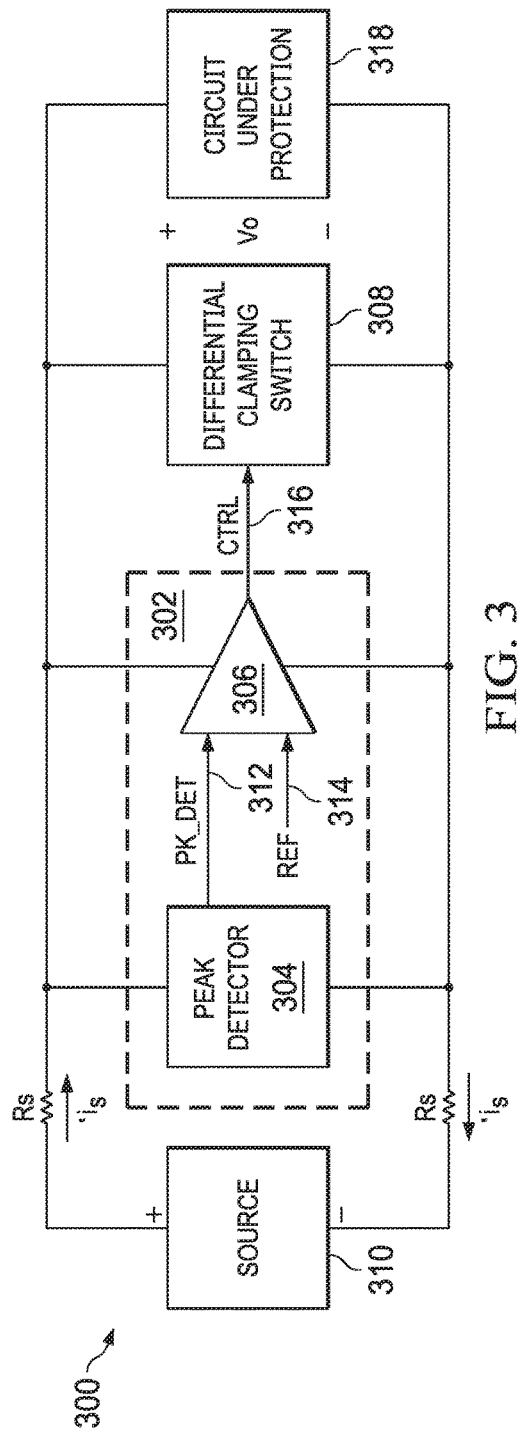
FIG. 3 illustrates a more detailed block diagram of an overrange signal limitation system implemented in accordance with a particular embodiment described herein.

Referring now to FIG. 3, illustrated therein is a more detailed block diagram of overrange signal limitation system 300 in accordance with an embodiment. As shown in FIG. 3, an overrange detection circuit 302 is implemented as a combination of a peak detector 304 and a comparator 306 and a clamping circuit controlled by the overrange detection circuit 302 is implemented as a clamping switch 308. In particular embodiments, the differential clamping switch 308 is implemented using a multi-terminal active device that exhibits a variable impedance $Z_0$ between two (input) terminals, wherein the value of $Z_O$ is controlled by the third (control) terminal. For example, a PMOS, NMOS, or CMOS FET or BJT, or any combination of these, could be used to implement the clamping switch 308. In operation, the peak detector 304 detects the amplitude of a signal generated by a source 310 and provides the value to the comparator 306 via a peak detect signal ("PK_DET") 312, which compares it to a clamp reference threshold ("REF") 314. When the value of PK_DET 312 exceeds the value of REF 314, as detected by the comparator 306, a control signal ("CTRL") 316 output from the comparator 306 drives on the clamping switch 308, which limits, or clamps, the amplitude of the signal applied to a CUP 318, as will be illustrated in greater detail below.

An advantage of using a peak detector to implement the overrange detector is that it enables a fast response to an overrange signal condition in a manner that is independent of the signal frequency while reducing the impact on distortion. Additionally, this embodiment enables achievement of fast "response" or "attack" times and slow "decay" or "recovery" times for optimum circuit behavior.

Figure 4:
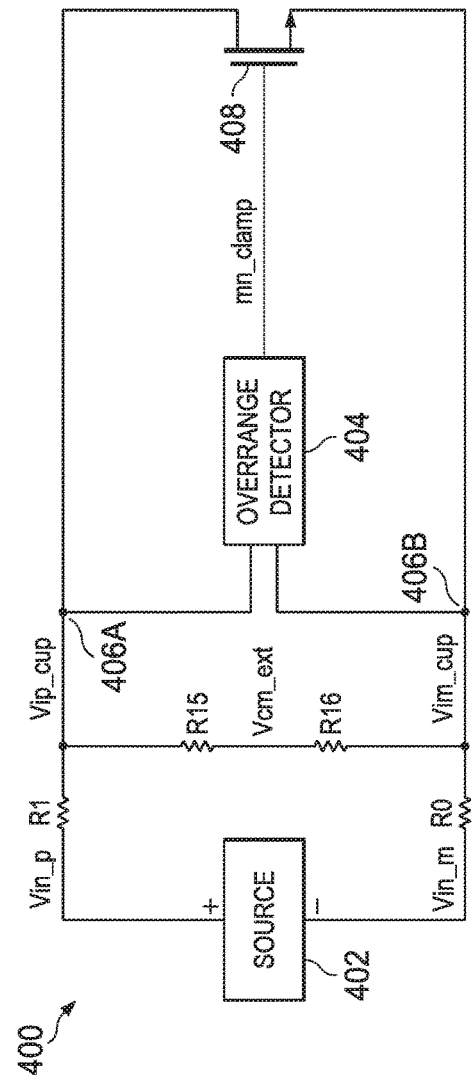
FIG. 4 is a high-level schematic diagram of a particular implementation of the overrange signal limitation system of FIG. 1 in accordance with embodiments described herein.

FIG. 4 is a high-level schematic diagram of a particular implementation of an overrange signal limitation system such as the system 100 of FIG. 1. The overrange detector (e.g., element 102 in FIG. 1) 404 could be implemented with a circuit such as 302 in FIG. 3 connected across vip_cup and vim_cup nodes 406A and 406B, respectively. Similarly, the clamping circuit (e.g., element 104 in FIG. 1) is implemented as a MOSFET device 408 configured as a switch with the source and drain terminals of the transistor connected to the vip_cup and vim_cup nodes 406A, 406B, respectively. It will be recognized that in the illustrated embodiment, the transistor operates symmetrically, such that either the source or the drain may be connected to either of the nodes 406A, 406B, without negatively impacting operation of the system. In operation, when either the vip_cup node 406A goes higher than a positive clamp reference voltage or the vim_cup node 406B goes lower than a negative clamp reference voltage (not shown in FIG. 4), the output of the comparator portion of the overrange detector 404 (which in the illustrated embodiment may be implemented as an amplifier because the clamping is gradual, as will be described) goes high, driving the gate of the transistor high and turning on the switch 408, thereby further dividing the voltage from the voltage source 402 provided to the circuit under protection ("CUP") connected across the vip_cup/vim_cup nodes (not shown in FIG. 4).

Figure 5:
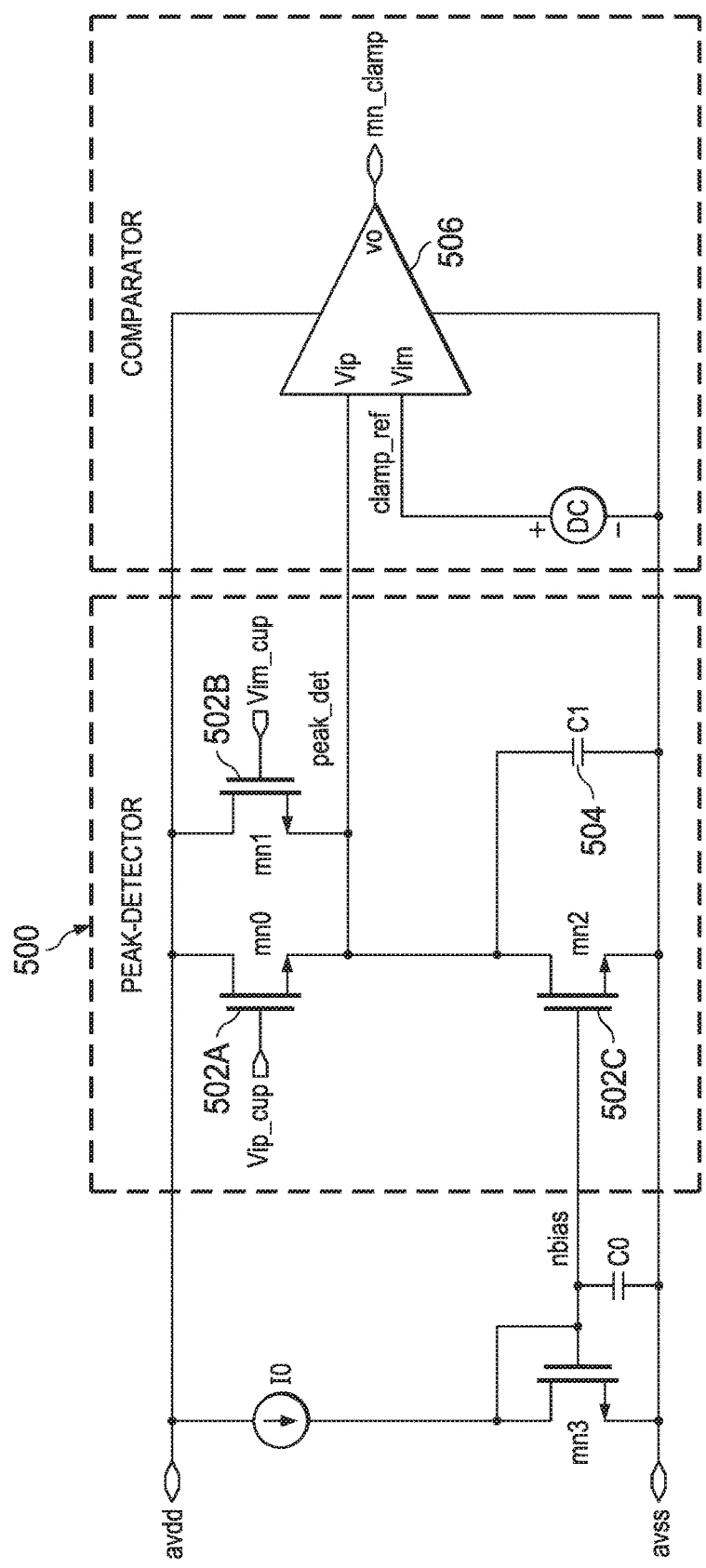
FIG. 5 is a high-level schematic diagram of a particular implementation of the overrange signal limitation system of FIG. 3 in accordance with embodiments described herein.

FIG. 5 is a high-level schematic diagram of a particular implementation of an overrange signal limitation system such as the one depicted in FIG. 3. As shown in FIG. 5, a peak detector 500 (e.g., element 304 of FIG. 3) may implemented using three MOSFET devices 502A-502C and a capacitor 504. The CUP inputs (vip_cup and vim_cup) are applied to the peak detector 500, which generates a peak detect ("peak_det") signal equivalent to the peak of the positive input signal ("vip_cup") applied to the gate of MOSFET 502A) or the peak of the negative input signal ("vim_cup") applied to the gate of MOSFET 502B. The combination of the MOSFET 502C and capacitor 504 comprise a source follower operating as a peak detector to maintain the value of the peak_det node at the peak level as the input signal cycles between peaks. The peak_det signal is compared to a clamp reference ("clamp_ref") signal by a fast comparator 506 (e.g., element comparator 306 of FIG. 3). If the peak_det signal is higher than the clamp_ref signal, then the output of the comparator 506 ("mn_clamp"), which functions as the control signal to the clamping circuit (not shown in FIG. 5), goes high to drive on the clamping switch. As illustrated in FIG. 5, the clamp_ref signal may be programmable and/or variable depending on the application. Additionally, as previously noted, the generated bits output from the overrange detection circuit 302 may also be used for AGC of the system. For example, the signal output from the comparator 506 provides an indication that the input signal falls outside an acceptable range. The comparator output may be input to AGC unit, or to the first circuit driving the system, to indicate that the input signal should be reduced and/or limited at the source (see, e.g., FIG. 1).

Additionally, as previously noted, the overrange detection circuit 302 may be configured to detect and provide an indication that the input signal has exceeded one or more other thresholds, whether or not indicative of an overrange condition with respect to the CUP. The resulting bits may also be used to provide AGC for the system 300 and used to adjust the level of the input signal accordingly (e.g., by comparing it to one or more additional preselected thresholds to determine whether action is necessary), whether or not an overrange condition exists or clamping is required.

Figure 6:
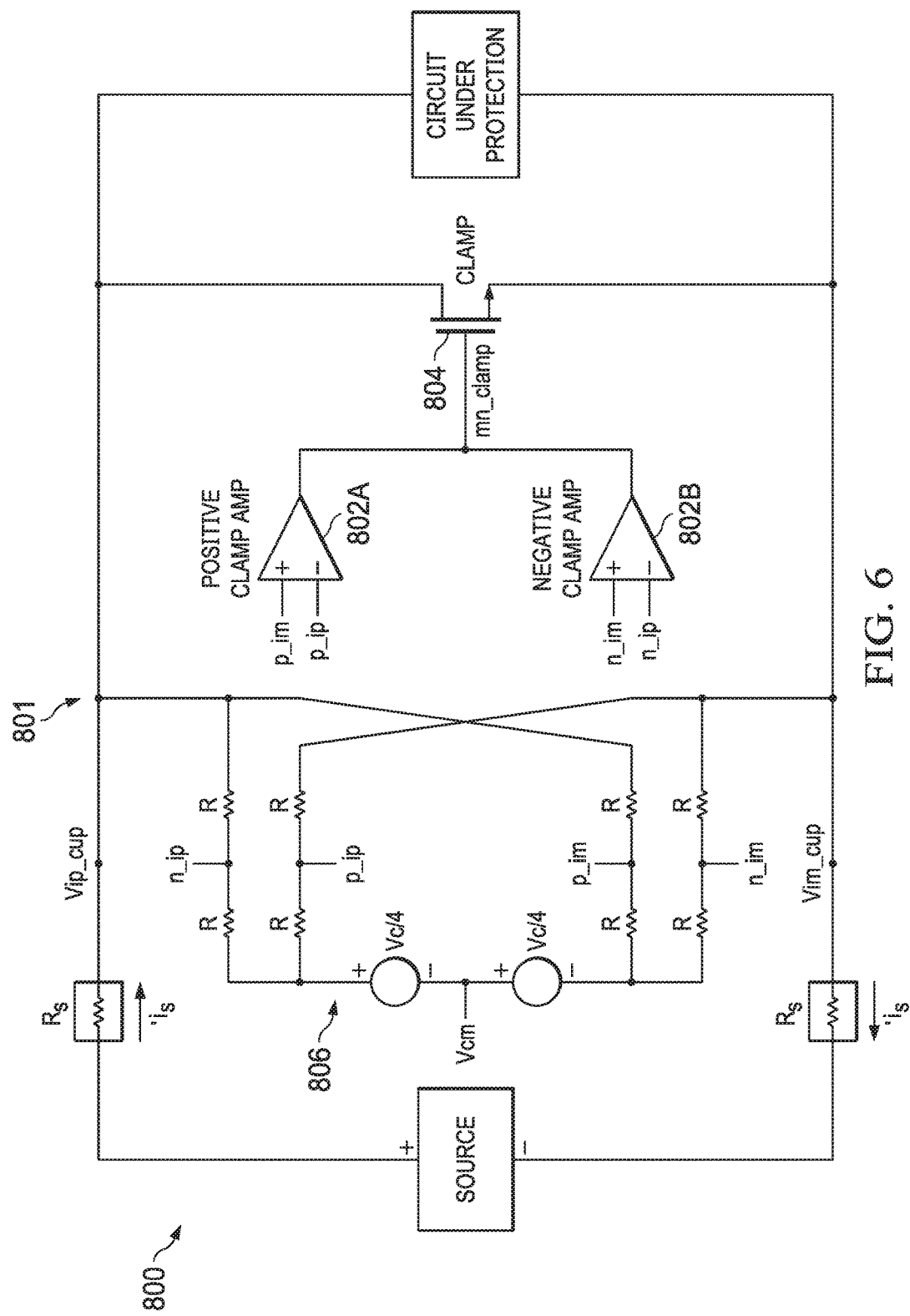
FIG. 6 illustrates a detailed block diagram of an alternative overrange signal limitation system implemented in accordance with embodiments described herein.

As an alternative to the embodiments of an overrange signal limitation system illustrated above that use a peak detector to implement the overrange detector, in an alternative embodiment, a pair of cross-coupled amplifiers may be used to detect overrange events and drive a clamping circuit. This may be accomplished as a linear system. Referring now to FIG. 6, illustrated therein is system block diagram of an alternative embodiment of an overrange signal limitation system 800 in which a circuit 801 including a pair of cross-coupled fast amplifiers 802A, 802B, is used to detect overrange events and drive a clamping switch 804 on when such events are detected. In the system 800, instead of using peak detection, the fast linear amplifiers 802A, 802B, the gains of which are set by a feedback path through a set of resistors 806, is used to drive the clamp on in response to detection of an overrange condition.

Figure 7:
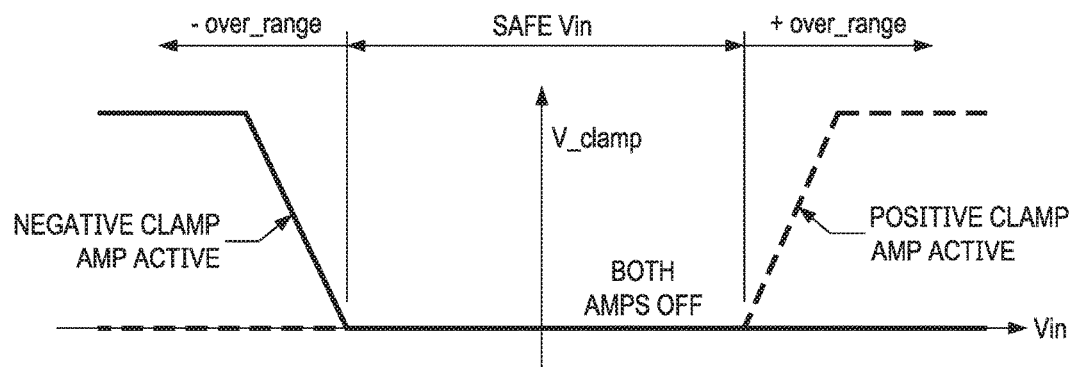
FIG. 7 illustrates transfer function of positive and negative clamp amplifiers that may be used to implement the alternative overrange signal limitation system of FIG. 6.

As shown in FIG. 6, the circuit 801 (should we clarify what is 800 and what is 801?) is configured such that the fast amplifier 802A, designated the positive clamp amplifier, pulls the gate of the clamping switch 804 high when the positive polarity (or "peak") of the input voltage exceeds the positive polarity of a clamping voltage, thereby turning on the clamping switch. The circuit 801 is further configured such that the fast amplifier 802B, designated the negative clamp amplifier, pulls the gate of the clamping switch high when the negative polarity (or "minimum") of the input voltage exceeds the negative polarity of the clamping voltage, thereby turning on the clamping switch. The circuit 801 is further configured such that only one of the amplifiers 802A, 802B, is active at any given time, thereby effectively implementing an OR function at the gate of the clamping switch. As shown in FIG. 6, Vcm is the common mode voltage (average (vip_cup+vim_cup)/2) of the input under nominal conditions), while the clamping voltages are output from amplifiers 802A (positive clamping voltage) and 802B (negative clamping voltage) (not clear). When the input voltage is within the range defined by the clamping voltage, neither of the amplifiers 802A, 802B is active and the clamping switch 804 remains off. A transfer function for the amplifiers 802A, 802B, is illustrated in FIG. 7.

Figure 8:
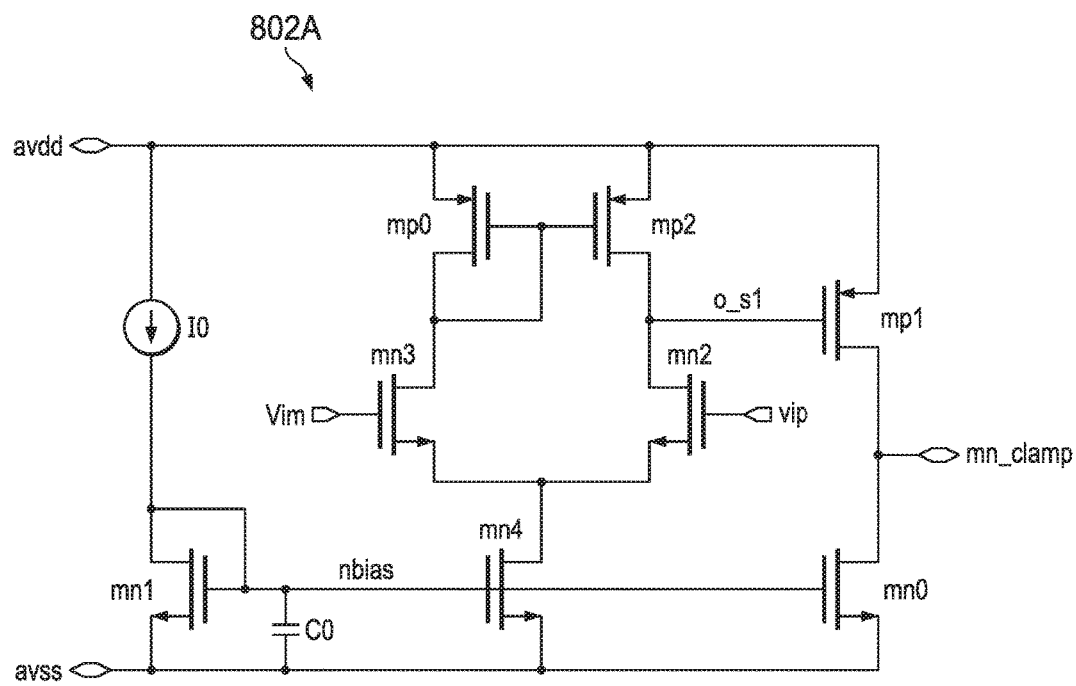
FIG. 8 is a high-level schematic diagram of a particular implementation of a clamp amplifier for use in implementing the overrange limitation system of FIG. 6 in accordance with embodiments described herein.

FIG. 8 is a schematic diagram of one implementation of the positive clamp amplifier, such as the amplifier 802A (FIG. 6), for use in the system 800 (FIG. 6). As shown in FIG. 8, the positive clamp amplifier is designed such that the output stage only tries to drive the switch 804 (FIG. 6) on (i.e., mn_clamp=high) when the peak input voltage exceeds a peak clamp voltage, indicative of an overrange condition. In cases in which the peak input voltage is less than the peak clamp voltage, the amplifier 802A exerts a weak pull-down current. With regard to the negative clamp amplifier (i.e., clamp amplifier 802B, FIG. 6), the amplifier is configured such that the output stage only tries to drive the switch 804 on (i.e., mn_clamp=high) when the minimum input voltage drops below the minimum clamp voltage. This allows either the positive or negative clamp amplifier to drive the clamp switch gate high without contention from the other; if neither amplifier is actively driving the clamp switch gate high in the manner previously described, the clamp switch gate remains low due to the weak pull-down and the switch remains off.

As another alternative to the embodiments of an overrange signal limitation systems illustrated and described above, it is possible to implement a system in which overrange conditions are detected using a small but fast comparator that triggers a clamping event. In the clamped condition, a peak detector driving an accurate comparator is tied to the input to detect that the input amplitude has been reduced to a safe level, at which point the clamp is released. An advantage of this alterative embodiment is that it has minimal impact on distortion; detection of an overrange condition using a small comparator results in minimal loading at the input. Additionally, the circuit is kept in a clamped/limited condition until the input amplitude returns to a safe level, making this alternative less dependent on the frequency of the input. In other words, the speed of the detection circuit is less critical. In addition, a detected input signal level and/or overrange condition may be output as digital bits to be used in the AGC system of the entire signal chain as indicated above.

Figure 9:
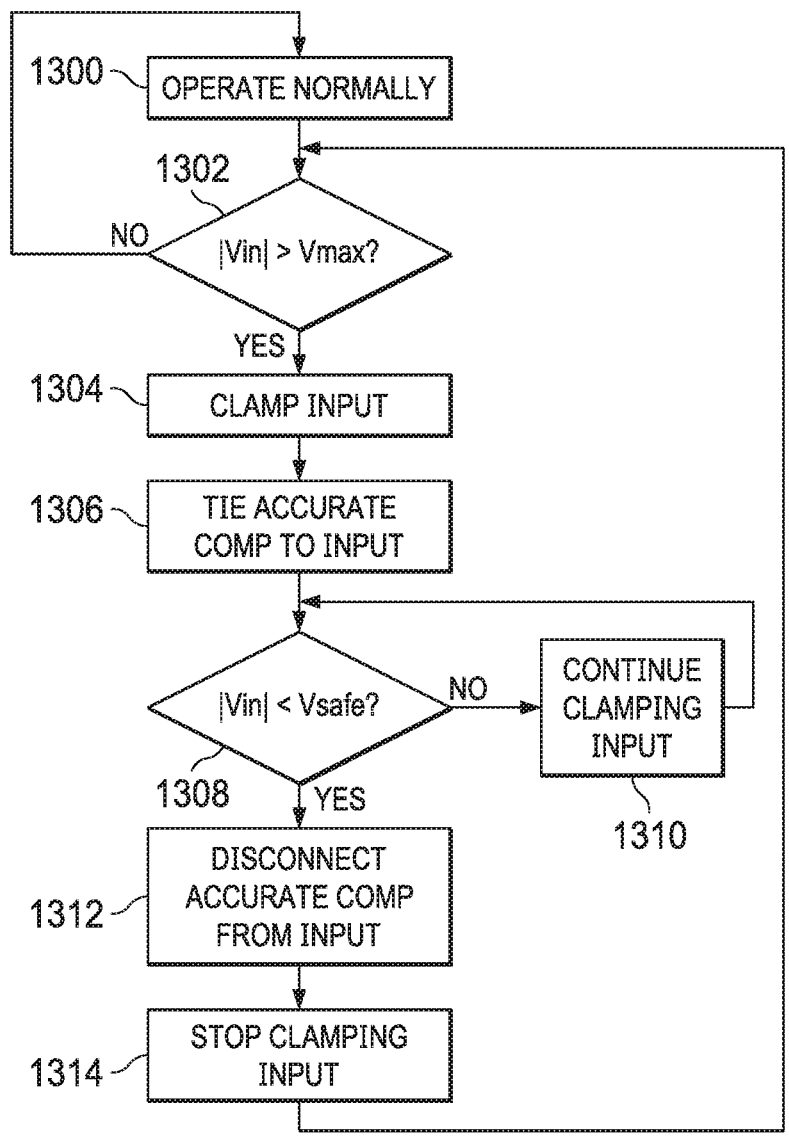
FIG. 9 is a flowchart illustrating operations performed by another alternative overrange signal limitation system implemented in accordance with embodiments described herein.

FIG. 9 is a flowchart illustrating operation of another alternative embodiment of an overrange signal limitation system such as described above. Referring to FIG. 9, in step 1300, the circuit is at normal operational state, meaning that the system is not clamped/limited. In step 1302, a determination is made whether the input voltage ("Vin") is greater than a clamping voltage ("Vmax"). If not, execution returns to step 1300 and the system remains in normal operation. If a positive determination is made in step 1302, execution proceeds to step 1304, in which the input is clamped. For example, step 1304 may be implemented by turning on a clamping switch disposed in parallel with the voltage source to reduce the resistance seen by the voltage source. In step 1306, an accurate comparator is tied to the input. In step 1308, a determination is made whether the input voltage is less than a safe voltage ("Vsafe"). If not, execution proceeds to step 1310 and clamping of the input voltage continues. If a positive determination is made at step 1308, execution proceeds to step 1312, in which the accurate comparator is disconnected from the input and then to step 1314, in which clamping of the input terminates (e.g., the clamping switch is turned off). Execution then returns to step 1302.

Figure 10:
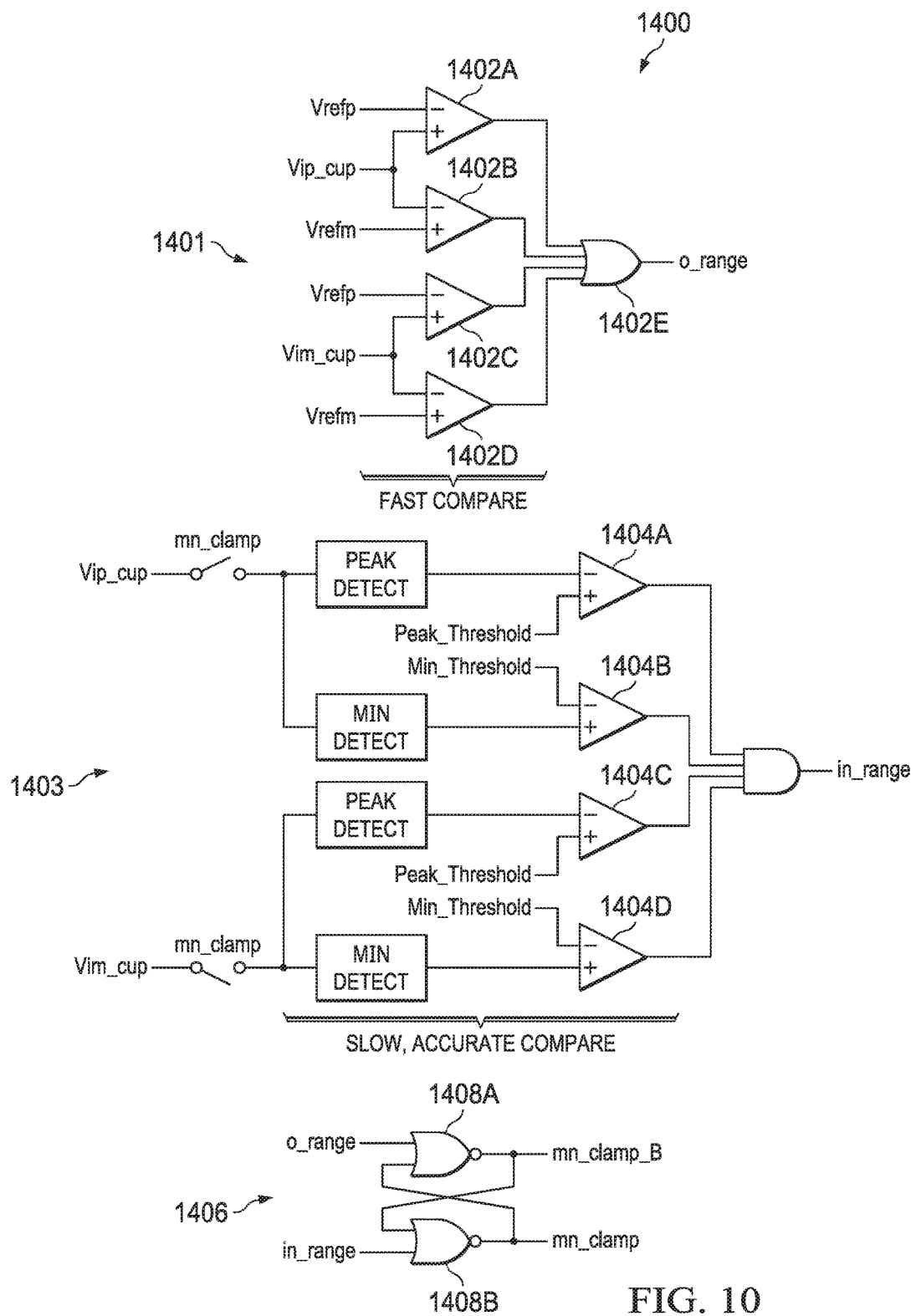
FIG. 10 illustrates a simplified block diagram of the alternative overrange signal limitation system for implementing the operations illustrated in FIG. 9 in accordance with embodiments described herein.

FIG. 10 illustrates a high-level schematic diagram of an embodiment of an overrange detection circuit 1400 for implementing the method illustrated in the flowchart of FIG. 9. As shown in FIG. 10, the overrange detection circuit 1400 includes a fast compare circuit 1401 including a number of fast comparators 1402A-1402D for comparing the input voltage to a clamp reference voltage. The output of the comparator 1402A remains low so long as the peak of the input voltage ("vip_cup") does not exceed the peak clamp reference voltage ("Vrefp"); once vip_cup exceeds Vrefp, the output of the comparator 1402A goes high.

The output of the comparator 1402B remains low so long as vip_cup exceeds the minimum clamp reference voltage ("Vrefm"); if vip_cup falls below Vrefm, the output of the comparator 1402B goes high. The output of the comparator 1402C remains low so long as the input voltage ("vim_cup") does not exceed Vrefp; once vim_cup exceeds Vrefp, the output of the comparator 1402C goes high. The output of the comparator 1402D remains low so long as vim_cup exceeds Vrefm; once vim_cup falls below Vrefm, the output of the comparator goes high. The outputs of comparators 1402A-1402D input to an OR gate 1402E, the output of which is an o_range signal that is driven high responsive to an overrange condition; that is, when vip_cup>Vrefp or vim_cup>Vrefp or vim_cup<Vrefm or vip_cup<Vrefm.

The overrange detector 1400 further includes an accurate compare circuit 1403 that includes four slow, accurate comparators 1404A-1404D for comparing vip_cup and vim_cup to peak and minimum thresholds ("peak_threshold" and "min_threshold"), respectively, when the accurate compare circuit is connected to the input voltage (FIG. 9, step 1306). The outputs of the comparators 1404A-1404D are ANDed to generate an in_range signal, which is driven high responsive to an in-range condition; that is, when both vip_cup and vim_cup are less than peak_threshold and both vip_cup and vim_cup are greater than min_threshold. In this case, because the comparison is slow, simply looking at the peak of vip_cup and minimum of vim_cup may be sufficient to guarantee that the input signal to the cup is reduced to a safe level.

The overrange detector 1400 further includes a switch driver circuit 1406, which includes two NOR gates 1408A and 1408B to implement an RS latch. One input of each NOR gate 1408A, 1408B, is coupled to the output of the other NOR gate. The second input of the NOR gate 1408A is coupled to receive the o_range signal from the fast compare circuit 1402, while the second input of the NOR gate 1408B is coupled to receive the in_range signal from the accurate compare circuit 1406. An mn_clamp signal output from the NOR gate 1408B is used to drive the clamping switch as well as to connect the accurate compare circuit 1403 to the input source. The accurate comparator may be tied to the input after some delay.

Figure 11A:
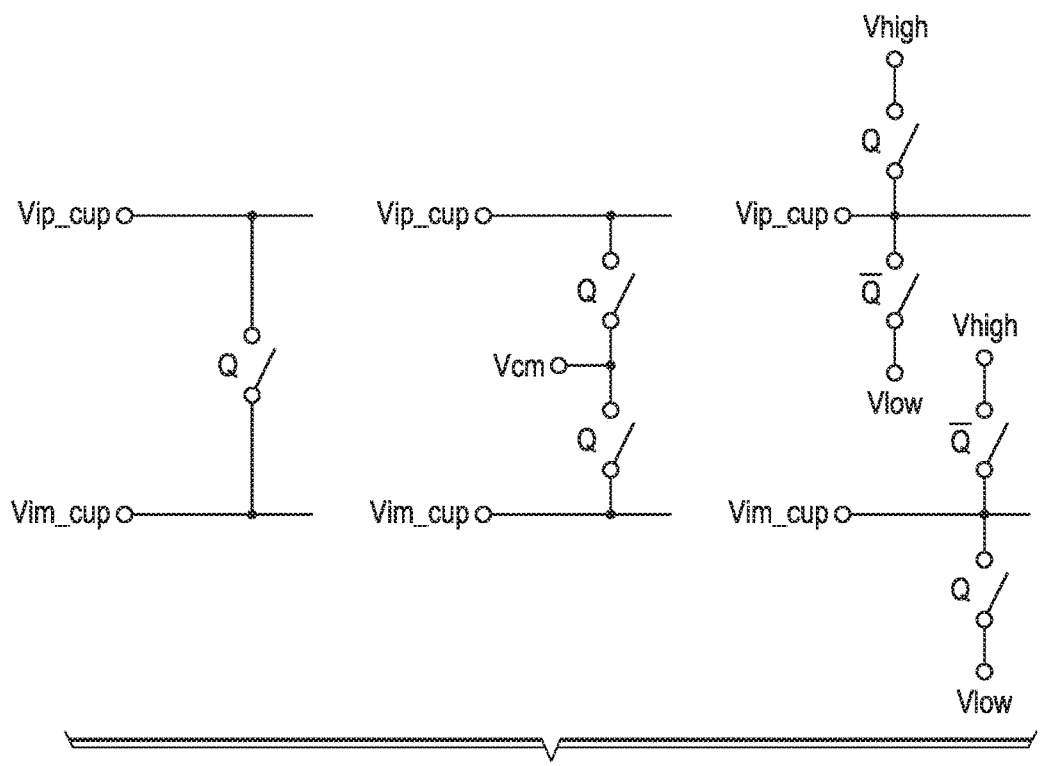
FIG. 11A illustrates block diagrams of examples of ways in which clamping circuits deployed in an overrange signal limitation system may be implemented in accordance with embodiments described herein.
Figure 11B:
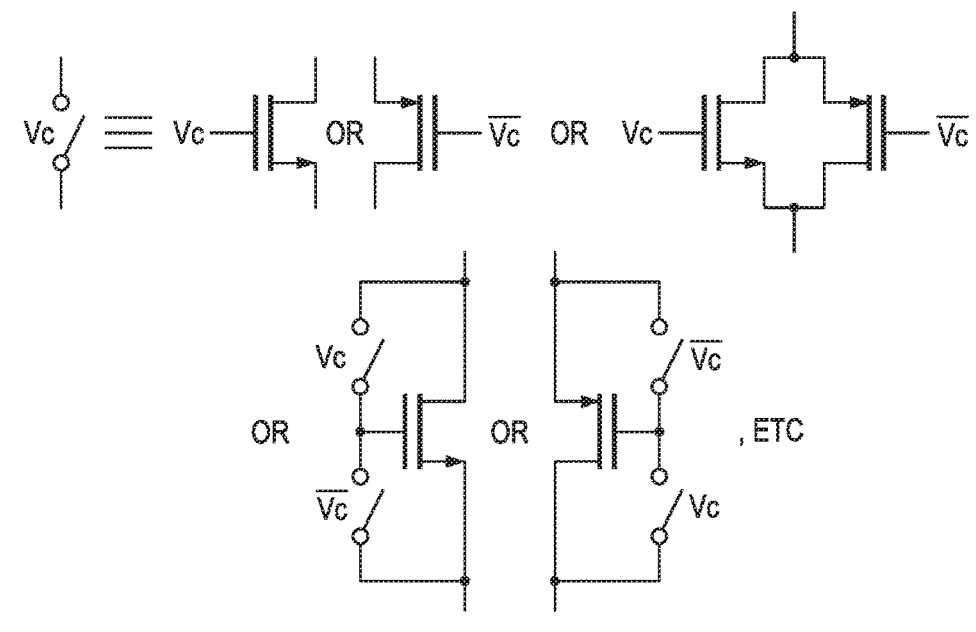
FIG. 11B illustrates block diagrams of examples of ways in which switches for implementing clamping circuits deployed in an overrange signal limitation system may be implemented in accordance with embodiments described herein.

FIG. 11A illustrates a variety of examples of ways in which the various clamping circuits illustrated herein may be implemented. Similarly, FIG. 11B illustrates a variety of examples of ways in which each of the switching devices illustrated in FIG. 11A may be implemented. It will be recognized that neither FIG. 11A nor 11B are intended to be comprehensive of all implementations of clamping circuits and switches for implementing such clamping circuits and are merely illustrative only.

Features of one or more of the various embodiments described herein include use of a differential clamping device implemented as a switch, which may also be implemented as a single-ended switch. For differential clamping, the TRUE and COMPLEMENT are ORed either in the detection of the overrange event or in the triggering of the clamping device. A peak detector may be used to implement an overrange detector to provide fast turn-on, proper operation with input frequencies beyond the clamp driver bandwidth, adjustable overrange trigger level, and controllable speed for turning off the clamping circuit. Alternatively, cross-coupled amplifiers may be used to implement the overrange detector. Linear detecting and clamping may also be implemented. Moreover, comparator detection and non-linear clamping may be implemented; that is, the clamp is fully on once triggered for a set time before it rechecks whether the input signal is back in range. An overrange detector could generate a control signal to the source to reduce its drive level. Once the input signal level and/or an overrange condition is detected, control bits can be generated to be used for AGC of the entire system, in addition to being used for clamping.

It should be noted that all of the specifications, dimensions, and relationships outlined herein (e.g., the number of elements, operations, steps, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, exemplary embodiments have been described with reference to particular component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to myriad other architectures.

It should also be noted that in this Specification, references to various features (e.g., elements, structures, modules, components, steps, operations, characteristics, etc.) included in "one embodiment", "exemplary embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It should also be noted that the functions related to circuit architectures illustrate only some of the possible circuit architecture functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departingfrom theteachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

Note that all optional features of the device and system described above may also be implemented with respect to the method or process described herein and specifics in the examples may be used anywhere in one or more embodiments.

The 'means for' in these instances (above) can include (but is not limited to) using any suitable component discussed herein, along with any suitable software, circuitry, hub, computer code, logic, algorithms, hardware, controller, interface, link, bus, communication pathway, etc.

Note that with the example provided above, as well as numerous other examples provided herein, interaction may be described in terms of two, three, or four network elements. However, this has been done for purposes of clarity and example only. In certain cases, it may be easier to describe one or more of the functionalities of a given set of flows by only referencing a limited number of network elements. It should be appreciated that topologies illustrated in and described with reference to the accompanying FIGURES (and their teachings) are readily scalable and can accommodate a large number of components, as well as more complicated/sophisticated arrangements and configurations. Accordingly, the examples provided should not limit the scope or inhibit the broad teachings of the illustrated topologies as potentially applied to myriad other architectures.

It is also important to note that the steps in the preceding flow diagrams illustrate only some of the possible signaling scenarios and patterns that may be executed by, or within, communication systems shown in the FIGURES. Some of these steps may be deleted or removed where appropriate, or these steps may be modified or changed considerably without departing from the scope of the present disclosure. In addition, a number of these operations have been described as being executed concurrently with, or in parallel to, one or more additional operations. However, the timing of these operations may be altered considerably. The preceding operational flows have been offered for purposes of example and discussion. Substantial flexibility is provided by communication systems shown in the FIGURES in that any suitable arrangements, chronologies, configurations, and timing mechanisms may be provided without departing from the teachings of the present disclosure.

Although the present disclosure has been described in detail with reference to particular arrangements and configurations, these example configurations and arrangements may be changed significantly without departing from the scope of the present disclosure. For example, although the present disclosure has been described with reference to particular communication exchanges, embodiments described herein may be applicable to other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 142 as it exists on the date of the filing hereof unless the words "means for" or "step for" are specifically used in the particular claims;

and (b) does not intend, by any statement in the specification, to limit this disclosure in any way that is not otherwise reflected in the appended claims.

What is claimed is:

1. An apparatus comprising:
a detector circuit electrically coupled to a signal source and a second circuit, the signal source generating a first signal, the detector circuit detecting a level of the first signal and generating a first control signal when the detected level of the first signal exceeds a first threshold value; and
a clamping switch electrically coupled to receive the first control signal from the detector circuit, the clamping switch comprising a multi-terminal active device;
wherein the first control signal controls a state of the clamping switch such that the clamping switch clamps a level of a signal applied to the second circuit when the level of the first signal exceeds the first threshold value; and
wherein the detector circuit comprises a peak detector circuit for detecting a peak value of the first signal, wherein the peak detector circuit comprises a first MOSFET device, a second MOSFET device coupled to the first MOSFET device, and a source follower coupled to the first and second MOSFET devices.

2. The apparatus of claim 1, wherein the source follower comprises a third MOSFET device and a capacitor.

3. The apparatus of claim 2, wherein the detector circuit comprises a comparator for comparing the detected peak value of the first signal with the first threshold value and generating the control signal when the detected peak value of the first signal exceeds the first threshold value.

4. The apparatus of claim 3, wherein the comparator comprises an amplifier.

5. The apparatus of claim 1, wherein the multi-terminal active device exhibits a variable impedance between first and second terminals thereof and a value of the variable impedance is controlled by a third terminal thereof.

6. The apparatus of claim 5, wherein the first control signal is applied to the third terminal of the multi-terminal active device.

7. The apparatus of claim 1, wherein the clamping switch comprises at least one of a p-channel metal oxide semiconductor field effect transistor ("PMOSFET"), an n-channel MOSFET ("NMOSFET"), a complementary MOSFET ("CMOSFET"), and a bi-polar junction transistor ("BJT").

8. The apparatus of claim 1, wherein bits corresponding to the first control signal are input to an Automatic Gain Control ("AGC") system for adjusting a level of the first signal.

9. The apparatus of claim 1, wherein the detector circuit further generates a second control signal when the level of the first signal exceeds a second threshold value.

10. The apparatus of claim 1, wherein bits corresponding to the second control signal are input to an Automatic Gain Control ("AGC") system for adjusting a level of the first signal.

11. An apparatus comprising:
a detector circuit electrically coupled between a signal source and a second circuit, the signal source generating a first signal, the detector circuit comparing the first signal with first and second threshold values and generating a control signal when the detected level of the first signal exceeds the first threshold value or falls below the second threshold value; and
a clamping switch electrically coupled to receive the control signal from the detector circuit, the clamping switch comprising a multi-terminal active device;
wherein the control signal controls a state of the clamping switch such that the clamping switch clamps a level of a signal applied to the second circuit when the detected level of the first signal exceeds the first threshold value or falls below the second threshold value;
wherein the detector circuit comprises a pair of cross-coupled fast amplifiers.

12. The apparatus of claim 11, wherein a first one of the pair of cross-coupled fast amplifiers is configured to generate the control signal when the first signal exceeds the first threshold value.

13. The apparatus of claim 11, wherein a second one of the pair of cross-coupled fast amplifiers is configured to generate the control signal when the first signal falls below the second threshold value.

14. The apparatus of claim 11, wherein the multi-terminal active device exhibits a variable impedance between first and second terminals thereof and wherein a value of the variable impedance is controlled by the third terminal and wherein the control signal is applied to the third terminal of the multi-terminal active device.

15. The apparatus of claim 11, wherein the clamping switch comprises at least one of a p-channel metal oxide semiconductor field effect transistor ("PMOSFET"), an n-channel MOSFET ("NMOSFET"), a complementary MOSFET ("CMOSFET"), and a bi-polar junction transistor ("BJT").

16. The apparatus of claim 11, wherein bits corresponding to the control signal are input to an Automatic Gain Control ("AGC") system for adjusting a level of the first signal.

17. A method comprising:
comparing a level of a first signal generated by a signal source to a first threshold value;
generating a first control signal if the level of the first signal exceeds the first threshold value;
using the first control signal to activate a clamping switch comprising a multi-terminal active device, wherein the first control signal is provided to a first terminal of the multi-terminal active device and controls a value of a variable impedance between second and third terminals of the multi-terminal active device; and
providing bits corresponding to the first control signal to an Automatic Gain Control ("AGC") system for adjusting a level of the first signal;
wherein activation of the clamping switch clamps a value of a signal applied to a circuit under protection ("CUP") to approximately the first threshold value.

18. The method of claim 17 further comprising:
generating a second control signal when the level of the first signal exceeds a second threshold value.

19. The method of claim 17 further comprising:
providing bits corresponding to the second control signal to an Automatic Gain Control ("AGC") system for adjusting a level of the first signal.

20. The method of claim 17, wherein the clamping switch comprises at least one of a p-channel metal oxide semiconductor field effect transistor ("PMOSFET"), an n-channel MOSFET ("NMOSFET"), a complementary MOSFET ("CMOSFET"), and a bi-polar junction transistor ("BJT").

* * * * *